(12) United States Patent
Shin et al.

(10) Patent No.: US 10,658,436 B2
(45) Date of Patent: May 19, 2020

(54) ORGANIC LIGHT EMITTING DISPLAY DEVICE TO IMPLEMENT NARROW BEZEL AND THIN THICKNESS

(71) Applicant: LG Display Co., Ltd., Seoul (KR)

(72) Inventors: HoWon Shin, Seoul (KR); Soyeon Jo, Asan-si (KR)

(73) Assignee: LG Display Co., Ltd., Seoul (KR)

( * ) Notice: Subject to any disclaimer, the term of this patent is extended or adjusted under 35 U.S.C. 154(b) by 47 days.

(21) Appl. No.: 15/851,231

(22) Filed: Dec. 21, 2017

(65) Prior Publication Data

US 2018/0182829 A1 Jun. 28, 2018

(30) Foreign Application Priority Data

Dec. 22, 2016 (KR) .................. 10-2016-0177100

(51) Int. Cl.
| | |
|---|---|
| *H01L 27/32* | (2006.01) |
| *H01L 51/52* | (2006.01) |
| *H01L 51/56* | (2006.01) |
| *G06F 1/16* | (2006.01) |
| *G09F 9/30* | (2006.01) |
| *H01L 51/00* | (2006.01) |

(52) U.S. Cl.
CPC ........ *H01L 27/3244* (2013.01); *G06F 1/1652* (2013.01); *G09F 9/301* (2013.01); *H01L 51/5246* (2013.01); *H01L 51/5256* (2013.01); *H01L 51/56* (2013.01); *G09G 2380/02* (2013.01); *H01L 51/0097* (2013.01); *H01L 2227/32* (2013.01); *H01L 2251/5338* (2013.01)

(58) Field of Classification Search
CPC ..................................................... H01L 25/167
See application file for complete search history.

(56) References Cited

U.S. PATENT DOCUMENTS

| | | | |
|---|---|---|---|
| 2003/0038590 A1* | 2/2003 | Silvernail | H01L 51/5259 313/504 |
| 2010/0308335 A1* | 12/2010 | Kim | H01L 27/3244 257/59 |
| 2014/0099999 A1* | 4/2014 | Hatano | H01L 27/3251 455/566 |

(Continued)

FOREIGN PATENT DOCUMENTS

| | | |
|---|---|---|
| KR | 20140085956 | 7/2014 |
| KR | 20140118676 | 10/2014 |

*Primary Examiner* — Thao X Le
*Assistant Examiner* — Geoffrey H Ida
(74) *Attorney, Agent, or Firm* — Fenwick & West LLP

(57) ABSTRACT

An organic light emitting display device according to an exemplary embodiment of the present disclosure includes a flexible substrate, an adhesive layer, a pad unit, and a module. The flexible substrate includes a display area in which a display unit is disposed, a first non-display area which encloses the display area, a bending area which extends from the first non-display area, and a second non-display area which extends from one side of the bending area. The adhesive layer is disposed on the display unit. The pad unit is disposed in the second non-display area of the flexible substrate. The module is connected to be in contact with the pad unit. In this case, the adhesive layer extends from the display area to the bending area to cover at least a part of the bending area of the flexible substrate.

18 Claims, 9 Drawing Sheets

(56) References Cited

U.S. PATENT DOCUMENTS

| | | | |
|---|---|---|---|
| 2014/0183473 A1* | 7/2014 | Lee | H01L 51/0097 257/40 |
| 2014/0217382 A1* | 8/2014 | Kwon | H01L 51/0097 257/40 |
| 2015/0137098 A1* | 5/2015 | Tanaka | H01L 27/3276 257/40 |
| 2016/0315264 A1* | 10/2016 | Shih | H01L 51/0024 |

* cited by examiner

ORGANIC LIGHT EMITTING DISPLAY DEVICE TO IMPLEMENT NARROW BEZEL AND THIN THICKNESS

CROSS-REFERENCE TO RELATED APPLICATIONS

This patent application claims the priority of Republic of Korea Patent Application No. 10-2016-0177100 filed on Dec. 22, 2016, in the Korean Intellectual Property Office, the disclosure of which is hereby incorporated by reference in its entirety.

BACKGROUND

Field of Technology

The present disclosure relates to an organic light emitting display device, and more particularly, to an organic light emitting display device which may implement a narrow bezel or bezel free.

Description of the Related Art

A display device which implements various information through a screen is a core device of an information communication era and is studied to be developed as a display device which becomes thinner, lighter, and portable and displays a high quality image. Display devices include an organic light emitting display device which is a self-emitting device, a plasma display device, and a liquid crystal display which requires a separate light source. Since the organic light emitting display device is implement without using a separate light source device, the organic light emitting display device may be easily implemented as a flexible display device. In this case, a flexible material such as plastic or metal foil is used for a substrate of the organic light emitting display device.

In the meantime, when the organic light emitting display device is implemented as a flexible display device, studies have been carried out to wrap or bend various parts of a display device using a flexible property. Such studies are carried out mainly for new designs and UI/UX and in some cases, the studies are carried out to reduce a size of a bezel of the display device.

As described above, when the substrate is bent in order to reduce a size of a bezel of the display device, it is required to secure not only a flexibility of the substrate, but also a flexibility of various insulating layers formed on the substrate and wiring lines which are formed of a metal material.

In the case of wiring lines, when the substrate on which the wiring lines are formed is bent, a stress is intensively generated in a wiring line which is disposed in the bent area so that the wiring line may be cracked. When the wiring line is cracked, the signals may not be normally transmitted so that a thin film transistor or an organic light emitting element is not normally operated, which results in malfunction of the light emitting display device.

In the case of the insulating layer, an inorganic film or an organic film which configures the insulating layer has brittleness, so that the flexibility of the insulating layer is considerably lower than that of the wiring line which is formed of metal. Therefore, when the substrate on which the insulating layer is formed is bent, the insulating layer is also cracked due to the stress caused by the bending.

When a partial area of the insulating layer is cracked, the crack is propagated to other areas of the insulating layer and is also propagated to a wiring line which is in contact with the insulating layer, which results in malfunction of the organic light emitting display device.

SUMMARY

An object to be achieved by the present disclosure is to provide an organic light emitting display device which minimizes a stress which is applied to a wiring line disposed in the bending area to implement a narrow bezel or bezel free.

Another object to be achieved by the present disclosure is to provide an organic light emitting display device which may minimize a damage of the wiring line caused by the bending.

Another object to be achieved by the present disclosure is to provide a thin organic light emitting display device by removing a barrier film which is used to protect an organic light emitting element.

Still another object to be achieved by the present disclosure is to provide an organic light emitting display device with a reduced manufacturing cost and a reduced number of processes by excluding a process of forming a separate protective layer on a bending area.

Objects of the present disclosure are not limited to the above-mentioned objects, and other objects, which are not mentioned above, can be clearly understood by those skilled in the art from the following descriptions.

According to an aspect of the present disclosure, there is provided an organic light emitting display device including a flexible substrate, an adhesive layer, a pad unit, and a module. The flexible substrate includes a display area in which a display unit is disposed, a first non-display area which encloses the display area, a bending area which extends from the first non-display area, and a second non-display area which extends from one side of the bending area. The adhesive layer is disposed on the display unit. The pad unit is disposed in the second non-display area of the flexible substrate. The module is connected to be in contact with the pad unit. In this case, the adhesive layer extends from the display area to the bending area to cover at least a part of the bending area of the flexible substrate. According to the organic light emitting display device according to the exemplary embodiment of the present disclosure, the adhesive layer which is disposed between the display unit and the polarization layer extends to the bending area. Therefore, it is possible to minimize a stress which is applied to wiring lines disposed in the bending area. Further, it is possible to reduce a thickness of the organic light emitting display device by removing a barrier film and solve an overflow failure which is generated during a process of forming a micro coating layer which is formed in the bending area when the barrier film is removed. Furthermore, a separate process of forming the micro coating layer may be omitted.

According to another aspect of the present disclosure, there is provided an organic light emitting display device including a flexible substrate, a display unit, an adhesive layer, a pad unit, and a plurality of wiring lines. The flexible substrate includes a first flat area, a bending area extending from the first flat area, and a second flat area extending from the bending area. The display unit is disposed in the first flat area of the flexible substrate. The pad unit is disposed in the second flat area of the flexible substrate. The plurality of wiring lines electrically connects the display unit and the pad unit to each other. In this case, the adhesive layer covers the display unit and a portion of the plurality of wiring lines which is disposed in the bending area.

Other detailed matters of the exemplary embodiments are included in the detailed description and the drawings.

According to the present disclosure, the adhesive layer which is disposed between the display unit and the polarization plate extends to the bending area so that a stress which is applied to a wiring line disposed on the bending area is minimized and thus a damage of the wiring line due to the bending is minimized.

According to the present disclosure, it is possible to reduce a thickness of the organic light emitting display by removing a barrier film and minimize an overflow failure which is generated during a process of forming a micro coating layer which is formed in the bending area when the barrier film is removed.

Further, according to the present disclosure, a process of forming a micro coating layer in the bending area through a separate process is omitted so that a manufacturing cost and a manufacturing time of the organic light emitting display device may be reduced.

By doing this, the present disclosure may provide an organic light emitting display device which implements a narrow bezel or bezel free.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
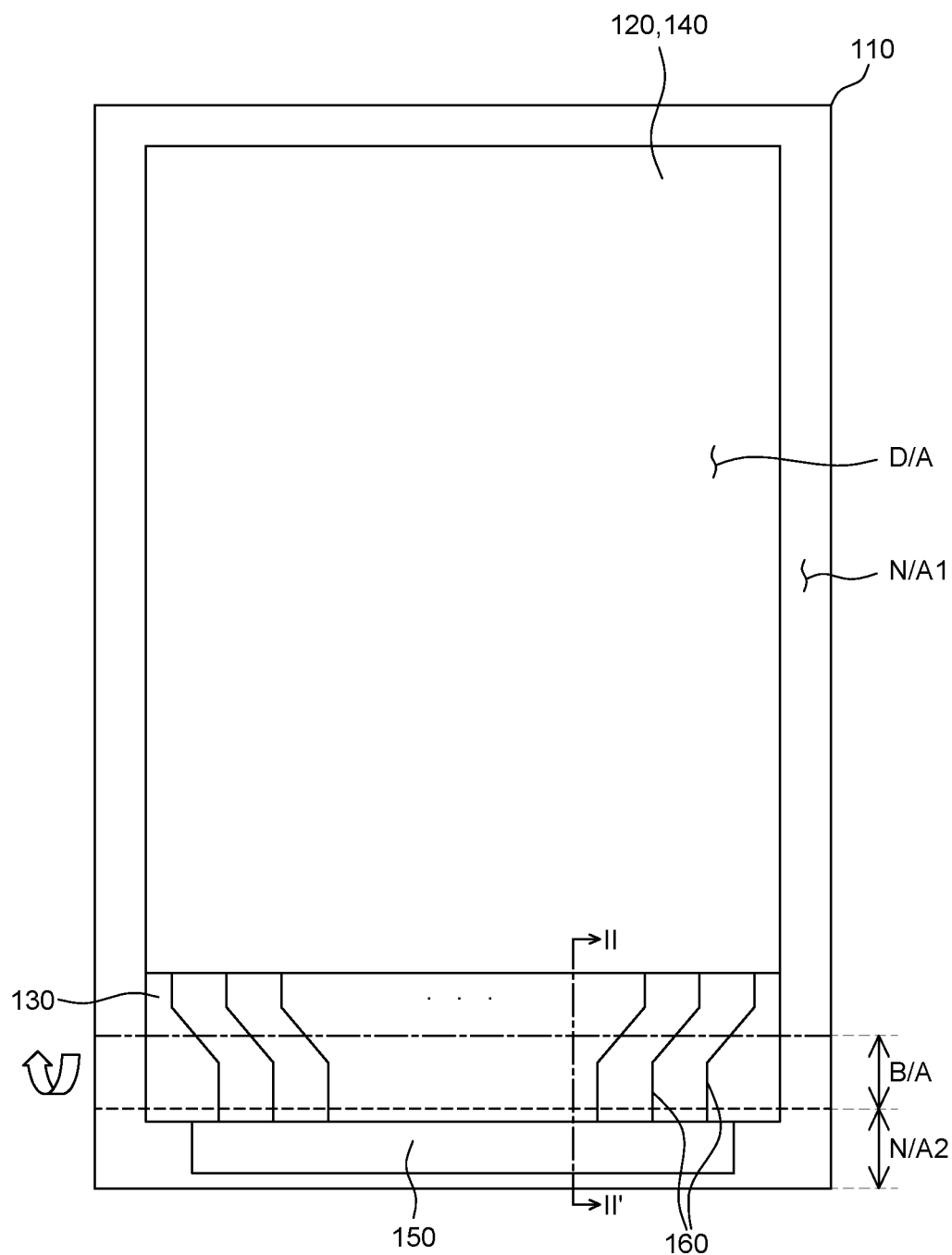
FIG. 1A is a schematic plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

In this specification, the flexible display device means a display device having a flexibility and also used as the same meaning as a bendable display device, a rollable display, an unbreakable display device, a foldable display device, a twistable display device, a stretchable display, a wrinkable display device, and the like. In this specification, the flexible organic light emitting display device means an organic light emitting display device among various flexible display devices.

The features of various embodiments of the present disclosure can be partially or entirely adhered to or combined with each other and can be interlocked and operated in technically various ways as understood by those skilled in the art, and the embodiments can be carried out independently of or in association with each other.

Hereinafter, various exemplary embodiments of the present disclosure will be described in detail with reference to accompanying drawings.

Figure 1B:
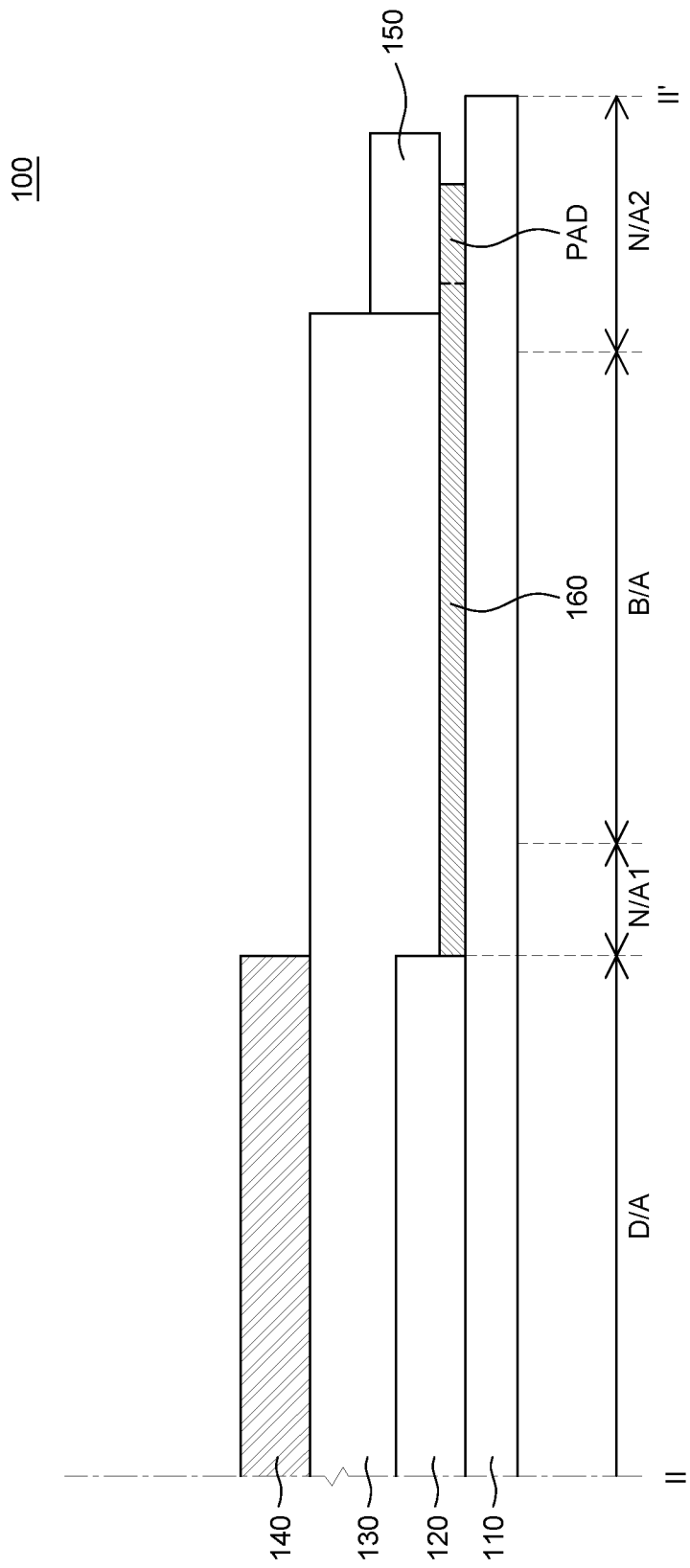
FIG. 1B is a cross-sectional view taken along the line II-II' of FIG. 1A according to an exemplary embodiment of the present disclosure.

FIG. 1A is a schematic plan view of an organic light emitting display device according to an exemplary embodiment of the present disclosure. FIG. 1B is a cross-sectional view taken along the line II-II' of FIG. 1A according to an exemplary embodiment of the present disclosure. Referring to FIGS. 1A and 1B, an organic light emitting display device 100 includes a flexible substrate 110, a display unit 120, an adhesive layer 130, a polarization layer 140, a module 150, a plurality of wiring lines 160, and a pad unit PAD. A specific shape of a thin film transistor and an organic light emitting element which are included in the display unit 120 is omitted in FIGS. 1A and 1B.

The flexible substrate 110 is a substrate which supports several components of the organic light emitting display device 100. The flexible substrate 110 may be bent. For example, the flexible substrate 110 may be bent in a horizontal direction, a vertical direction, or a diagonal direction. Therefore, the flexible substrate 110 may be bent in a combination of the vertical, horizontal, and diagonal directions, based on a design required for the organic light emitting display device 100.

The flexible substrate 110 may be formed of a material having flexibility so as to be bent. For example, the flexible substrate 110 may be implemented by a thin film plastic film formed of a polymer such as polyimide, polyethylene naphthalate (PEN), or polyethylene terephthalate (PET).

The flexible substrate 110 includes a display area D/A, a first non-display area N/A1, a bending area B/A, and a second non-display area N/A2.

The display area D/A is an area where the display unit is disposed. The display area means an area where an image is displayed and is referred to as an active area. The first non-display area N/A1 may be disposed around the display area D/A. The first non-display area N/A1 may be referred to as an inactive area.

The first non-display area N/A1 may be in contact with one or more sides of the display area D/A. For example, as illustrated in FIG. 1, the non-display area N/A1 encloses a quadrangular display area D/A. However, a shape and an arrangement of the display area D/A and the first non-display area N/A1 which is in contact with the display area D/A are not limited to the example illustrated in FIG. 1.

The display area D/A and the first non-display area N/A1 may have a shape appropriate for a design of an electronic apparatus in which the organic light emitting display device 100 is mounted. For example, the display area D/A may be formed in the form of a pentagon, a hexagon, a circle, an ellipse, or the like. In the first non-display area N/A1, a gate driver and a data driver which are driving circuit units to allow the display unit 120 of the display area D/A to emit light and wiring lines are disposed. The gate driver and the data driver may be implemented by thin film transistors (TFT). The drivers may be referred to as a gate-in-panel (GIP).

The bending area B/A is disposed to extend from one side of the first non-display area N/A1. The bending area B/A is an area where the flexible substrate 110 is bent and serves as a non-display area where an image is not displayed. However, the present disclosure is not limited thereto and the organic light emitting display device 100 may be implemented such that the image is also displayed in the bending area. That is, a part of the display area D/A may be bent. In this case, an image may be displayed in a bent area of the display area D/A. In FIGS. 1A and 1B, it is illustrated that the bending area B/A of the flexible substrate 110 is connected to the first non-display area N/A1 which completely encloses the display area D/A. However, the bending area B/A may be a non-display area which is directly connected to the display area D/A.

The second non-display area N/A2 may be disposed to extend from one side of the bending area B/A. The second non-display area N/A2 may be defined as a non-bending area which is disposed in an opposite side of the first non-display area N/A1 with respect to the bending area B/A.

The display unit 120 is disposed on the flexible substrate 110. The display unit 120 may be disposed so as to correspond to the display area D/A of the flexible substrate 110, but is not limited thereto.

The display unit 120 may be configured to display an image. Even though not illustrated in FIGS. 1A and 1B, the display unit 120 may include an organic light emitting element and a driving circuit for driving the organic light emitting element. The organic light emitting element includes an anode, a plurality of organic layers, and a cathode so that electrons and holes are coupled to each other to emit light. The plurality of organic layers includes a hole injection layer HIL, a hole transport layer HTL, an organic emitting layer EML, an electron transport layer ETL, and an electron injection layer EIL, but is not limited thereto. Further, the driving circuit is a circuit unit which drives the organic light emitting element. The driving circuit may be formed of various circuit components such as a switching thin film transistor, a driving thin film transistor, and a capacitor and various wiring lines, but is not limited thereto. Even though not illustrated in FIGS. 1A and 1B, various insulating layers may be formed between the flexible substrate 110 and the display unit 120. Further, at least some of the insulating layers which are formed between the flexible substrate 110 and the display unit 120 may also be formed in the non-display areas N/A1 and N/A2, and the bending area.

A plurality of wiring lines 160 is formed on the flexible substrate 110. The plurality of wiring lines 160 extends to the second non-display area N/A2 via the first non-display area N/A1 and the bending area B/A from the display area D/A to be connected to the pad unit PAD. The plurality of wiring lines 160 transmits various electric signals which is transmitted through the pad unit PAD to the driving circuit such as the thin film transistor of the display unit 120 disposed in the display area D/A. Since some of the plurality of wiring lines 160 is disposed on the bending area B/A, when the bending area B/A is bent, the plurality of wiring lines is also bent.

The plurality of wiring lines 160 may be formed of metal having excellent conductivity. For example, the plurality of wiring lines 160 may be formed of the same metal as the source electrode or the drain electrode of the thin film transistor. However, the plurality of wiring lines 160 is not limited thereto and may be formed of the same metal as a gate electrode of the thin film transistor.

Further, differently from the wiring lines disposed in the non-display area, the plurality of wiring lines 160 disposed in the bending area B/A is applied with a stress due to the bending of the flexible substrate 110. Therefore, the plurality of wiring lines disposed in the bending area needs to be designed to be strong against the stress and have a low resistance. Further, the plurality of wiring lines 160 needs to have sufficient flexibility to easily bend the flexible substrate 110. For example, the plurality of wiring lines 160 may have a single line structure having a zig-zag pattern or a repeated pattern structure having a rhombus shape. Further, the plurality of wiring lines 160 may be formed of a single metal layer structure or formed of a multiple layer structure in which a plurality of metal layers is laminated. Specifically, the plurality of wiring lines 160 may be formed of a layer of two or more selected from aluminum (Al), titanium (Ti), molybdenum (Mo), and copper (Cu) layers. An example of the combination includes a structure (Ti/Al/Ti) in which an aluminum layer is disposed between titanium layers, a structure (Mo/Al/Mo) in which an aluminum layer is disposed between molybdenum layers, a structure (Ti/Cu/Ti) in which a copper layer is disposed between titanium layers, a structure (Mo/Cu/Mo) in which a copper layer is disposed between molybdenum layers, and the like. The plurality of wiring lines 160 having the above-described multilayer structure may have excellent conductivity due to a low contact resistance between the metal layers while maintaining a sufficient flexibility.

In the meantime, even though not illustrated in FIGS. 1A and 1B, in order to suppress corrosion or damage of the plurality of wiring lines 160, a protective layer may be formed on the plurality of wiring lines 160. In this case, the protective layer may be the same layer as one or more of various insulating layers such as a passivation layer which covers a thin film transistor of the display unit 120, a gate insulating layer which is used for electrical insulation between an active layer, the gate electrode, the source electrode, and the drain electrode in a thin film transistor, and an interlayer insulating layer.

The pad unit PAD is disposed in the second non-display area N/A2 of the flexible substrate 110. The pad unit PAD may be configured by a plurality of pad electrodes. The pad unit PAD is an area where the module 150 is attached to electrically connect the module 150 and the plurality of pad electrodes. Referring to FIG. 1B, the pad unit PAD may be a metal layer which extends from the plurality of wiring lines 160 extending from the bending area B/A. The second non-display area N/A2 is an area which is connected to the module 150 so that it is not bent but is planarized.

The module 150 is disposed on the pad unit PAD. The module 150 is a driving unit which supplies a data signal to the display unit 120 or a film which is connected to the driving unit.

For example, the module 150 may be an integrated circuit chip (IC chip) including a driving unit. The integrated circuit chip may be directly connected to the pad unit PAD to be directly mounted on an upper surface of the flexible substrate 110. The integrated circuit chip may be directly disposed on the flexible substrate 110 in a chip-on-film (COF) manner.

Further, the module 150 may be a flexible circuit film which is connected to a printed circuit board (PCB) on which the driving unit is disposed. The flexible circuit film transmits various signals from the printed circuit board to the display unit 120. A plurality of wiring lines 160 may be disposed on the flexible circuit film or in the flexible circuit film so that the printed circuit board and the pad unit PAD are electrically connected to each other. In the meantime, the flexible circuit film may be a flexible printed circuit board (FPCB) in which a separate printed circuit board is not attached, but the flexible circuit film serves as a printed circuit board.

The module 150 is electrically connected to the pad unit PAD. Therefore, the module 150 is disposed on the pad unit PAD disposed in the second non-display area N/A2 of the flexible substrate 110. Even though it is illustrated that both ends of the module 150 is disposed to protrude more than ends of the pad unit PAD in FIG. 1B, at least one end of the module 150 may be disposed to be aligned with one end of the pad unit PAD.

The adhesive layer 130 is disposed on the display unit 120. Referring to FIGS. 1A and 1B, the adhesive layer 130 is disposed on the display area D/A on the flexible substrate 110 and extends from the display area D/A to the bending area B/A to cover at least a part of the bending area B/A. The adhesive layer 130 extends from the display area D/A to cover the plurality of wiring lines 160 which crosses the first non-display area N/A1 and the bending area B/A. Further, the adhesive layer 130 may be disposed to be in contact with the module 150. Referring to FIG. 1A, when the adhesive layer 130 is in contact with the module, all the plurality of wiring lines 160 disposed on the first non-display area N/A1, the bending area B/A, and the second non-display area N/A2 is disposed below the adhesive layer 130 so as not to be exposed to the air.

The adhesive layer 130 functions to bond the display unit 120 and the polarization layer 140 to each other on the display area D/A. Therefore, the adhesive layer 130 necessaries an adhesive strength enough to bond the display unit 120 and the polarization layer 140. In FIG. 1B, for the convenience of description, it is illustrated that the adhesive layer 130 is disposed on the display unit 120 and the polarization layer 140 is disposed on the adhesive layer 130. However, the organic light emitting display device 100 includes an encapsulation layer disposed between the display unit 120 and the adhesive layer 130. Further, the adhesive layer 130 and the polarization layer 140 may be disposed on the encapsulation layer. The encapsulation unit is a configuration which protects the organic light emitting element from moisture or oxygen penetrating from the outside. The encapsulation unit has a structure in which an inorganic layer and an organic layer are alternately laminated, but is not limited thereto.

Further, when the flexible substrate 110 and the plurality of wiring lines 160 in the bending area B/A are bent toward a rear surface direction to implement a narrow bezel, the adhesive layer 130 functions to adjust a neutral plane of the bending area B/A.

When a structure is bent, the neutral plane refers to a virtual plane on which a compressive force and a tensile force which are applied to the structure are cancelled so that no stress is applied. When two or more structures are laminated, a virtual neutral plane may be formed between structures. When the entire structures are bent in one direction, structures disposed in the bending direction with respect to the neutral plane are compressed due to the bending so that the compressive force is applied to the structures. In contrast, structures which are disposed in an opposite direction to the bending direction with respect to the neutral plane are stretched due to the bending, so that the tensile force is applied to the structures. In this case, when the tensile force between the compressive force and the tensile force with the same magnitude is applied, the structures are weaker, so that when the tensile force is applied, a possibility of generating a crack is higher.

More specifically, the neutral plane is determined in consideration of a thickness, a Young's modulus, and a material of the components disposed in the corresponding area. For example, as it will be described below with reference to FIG. 1C, when the bending area B/A is bent toward the rear surface, the neutral plane may be formed between the flexible substrate 110 and the plurality of wiring lines 160 or formed on the flexible substrate 110. Therefore, when the bending area B/A is bent toward the rear surface, the flexible substrate 110 which is disposed below the neutral plane is compressed so that the compressive force is applied to the flexible substrate. Further, the plurality of wiring lines 160 which is disposed above the neutral plane is applied with the tensile force. Therefore, the plurality of wiring lines 160 may be cracked due to the tensile force. Therefore, in order to minimize the tensile force which is applied to the plurality of wiring lines 160, it is considered to dispose the plurality of wiring lines 160 on the neutral plane.

To this end, the adhesive layer 130 is disposed on the bending area B/A to raise the neutral plane in an upward direction. Specifically, the adhesive layer 130 is disposed on the bending area B/A, so that the neutral plane may be formed in the same position as the plurality of wiring lines 160 or located in a higher position than the plurality of wiring lines 160. Therefore, the plurality of wiring lines 160 is not applied with the stress or applied with the compressive force at the time of bending, so that even though the bending area is bent toward the rear surface of the flexible substrate 110, the generation of the crack may be significantly suppressed.

As described above, the neutral plane is affected by the thickness and the Young's modulus of the adhesive layer 130 disposed on the bending area B/A. The larger the thickness of the adhesive layer 130, the higher the neutral plane. Therefore, in order to dispose the plurality of wiring lines 160 below the neutral plane, the thickness of the adhesive layer 130 may be increased. However, when the thickness of the adhesive layer 130 is too large, an entire thickness of the display device is increased, which hinders the reduction of the thickness of the organic light emitting display device 100 and causes a problem in the manufacturing process of the organic light emitting display device 100. In contrast, when the thickness of the adhesive layer 130 is too small, the neutral plane may not be disposed below the plurality of wiring lines 160, so that it may be difficult to implement a sufficient adhesiveness. Therefore, the thickness of the adhesive layer 130 may be determined in consideration of the above description. For example, the thickness of the adhesive layer 130 may be 30 µm to 70 µm, but is not limited thereto.

Similarly, the Young's modulus of the adhesive layer 130 may be determined to locate the neutral plane below the plurality of wiring lines 160. The Young's modulus is a value indicating flexibility and is a unique characteristic of a material which indicates a degree of resistance to tensile or compressive stress of the material. When a Young's modulus of a specific material is high, the resistance to the tensile or compressive stress is also large so that it is difficult to modify a shape of the material. In contrast, when the Young's modulus is low, the resistance to the tensile or compressive stress is low, so that it is easy to modify the shape of the material. When the Young's modulus of the adhesive layer 130 is high, the position of the neutral plane may be raised. However, when the Young's modulus of the adhesive layer 130 is excessively high, the adhesive layer 130 may be cracked during the bending process. Further, when the Young's modulus of the adhesive layer 130 is low, the neutral plane may not be disposed below the plurality of wiring lines 160. Therefore, the Young's modulus of the adhesive layer 130 may be determined in consideration of the above description.

Further, the adhesive layer 130 may include a material which suppresses the permeation of moisture, such as a moisture absorbent or a desiccant to protect a wiring line disposed in the bending area B/A. For example, the adhesive layer 130 may be configured to disperse the moisture absorbent or the desiccant into a base layer formed of an adhesive material. However, it is not limited thereto and a configuration of the adhesive layer 130 may vary according to a design.

The polarization layer 140 is disposed on the adhesive layer 130. The polarization layer 140 is in contact with the adhesive layer to suppress reflection of external light. Specifically, when the organic light emitting display device 100 is used at the outside, external natural light enters to be reflected by the anode or the cathode of the organic light emitting element or reflected by metal electrodes disposed below the organic light emitting element. In this case, the image of the organic light emitting display device 100 may not be visibly recognized due to the reflected light. The polarization layer 140 polarizes the light entering from the outside to a specific direction and suppress the light reflected by the reflector or the metal electrode of the anode from being emitted to the outside of the organic light emitting display device 100.

The polarization layer 140 may be disposed on the display area D/A of the flexible substrate 110, but is not limited thereto. Further, the polarization layer 140 may be disposed to correspond to the display unit 120, but is not limited thereto. That is, the polarization layer 140 is disposed in the display area D/A so that the polarization layer 140 and the adhesive layer 130 may form a step. That is, one end of the polarization layer 140 which is adjacent to the bending area B/A may be disposed inside the organic light emitting display device 100 more than one end of the adhesive layer 130 which covers the bending area B/A.

In the meantime, the polarization layer 140 may be polarization plate which is formed of a polarizer and a protective film protecting the polarizer or may be formed so as to coat a polarization material for flexibility.

Figure 1C:
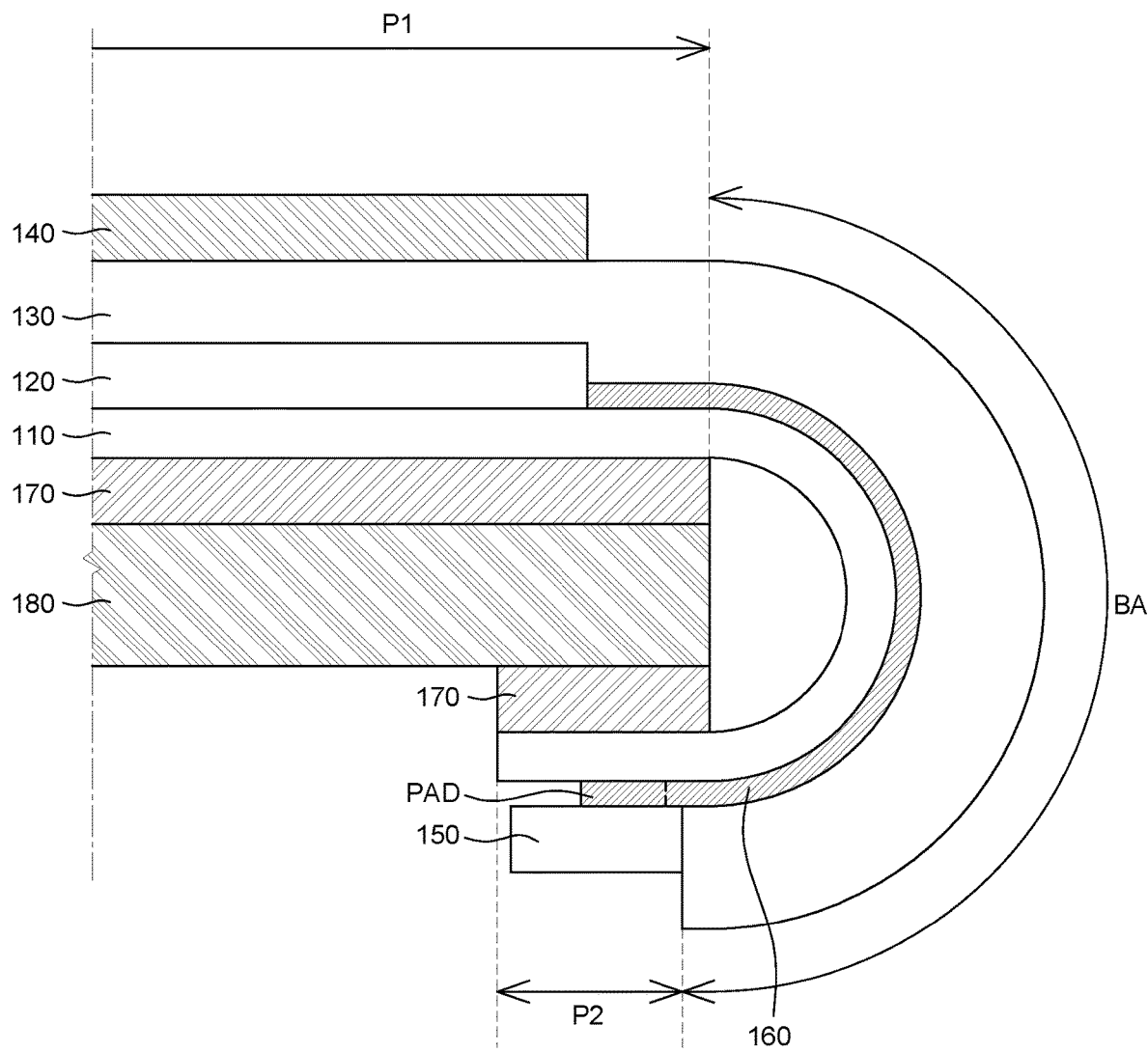
FIG. 1C is a schematic cross-sectional view when an organic light emitting display device according to an exemplary embodiment of the present disclosure is bent.

FIG. 1C is a schematic cross-sectional view when an organic light emitting display device 100 according to an exemplary embodiment of the present disclosure is bent. In FIG. 1C, it is illustrated that the bending area B/A of the organic light emitting display device 100 illustrated in FIGS. 1A and 1B is bent.

Referring to FIG. 1C, as the bending area B/A is bent, the second non-display area N/A2 of the flexible substrate 110 may be disposed below the display area D/A of the flexible substrate 110. Specifically, an upper portion of the organic light emitting display device 100 through a user visibly recognizes an image is configured by the display area D/A and the first non-display area N/A1 and the display area D/A and the first non-display area N/A1 may configure a first flat area P1. Further, the second non-display area N/A2 is disposed in a lower portion of the organic light emitting display device 100, that is, an opposite side of the display area D/A. The second non-display area N/A2 is an area where the module 150 is disposed and is configured as a second flat area P2.

Referring to FIG. 1C, a back plate 170 is disposed below the flexible substrate 110. As described above, when the flexible substrate 110 is formed of a plastic material such as polyimide PI, a manufacturing process of the organic light emitting display device 100 is performed in a situation in which a supporting substrate formed of glass is disposed below the flexible substrate 110 and the supporting substrate may be released after completing the manufacturing process of the organic light emitting display device 100. However, after the supporting substrate is released, a component for supporting the flexible substrate 110 is still necessary. Therefore, the back plate 170 for supporting the flexible substrate 110 may be disposed below the flexible substrate 110. The back plate 170 may be disposed so as to be adjacent to the bending area B/A in an area of the flexible substrate 110 other than the bending area B/A. For example, the back plate 170 may be disposed in the display area D/A and a part of the first non-display area N/A1 and in the second non-display area N/A2. The back plate 170 may be formed of a plastic thin film formed of polyimide (PI), polyethylene naphthalate (PEN), polyethylene terephthalate (PET), other suitable polymers, a combination thereof, or the like.

A supporting member 180 is disposed between two back plates 170 and the supporting member 180 may be bonded to the back plate 170 by a separate adhesive layer 130. The supporting member 180 is disposed between the back plates 170 to define and maintain a bending curvature of the bending area B/A. The supporting member 180 may be formed of a plastic material such as polycarbonate (PC), polyimide (PI), polyethylene naphthalate (PEN), and polyethylene terephthalate (PET), other suitable polymers, or a combination thereof. A strength of the supporting member 180 formed of the plastic materials may be controlled by providing additives to increase a thickness and/or strength of the supporting member 180. Further, the supporting member 180 may be formed of glass, ceramic, metal, or other rigid materials, or a combination of the above-mentioned materials.

In the organic light emitting display device 100 according to the exemplary embodiment of the present disclosure, the adhesive layer 130 is disposed on a wiring line disposed in the bending area B/A. Therefore, the wiring line disposed in the bending area B/A is physically protected by the adhesive layer 130 disposed on the wiring line and corrosion and damages of the wiring line due to moisture or oxygen which may be permeated from the outside may be minimized.

Further, in the organic light emitting display device 100 according to the exemplary embodiment of the present disclosure, a crack of the wiring line may be suppressed by the adhesive layer 130 which is disposed to cover the wiring line in the bending area B/A. As described above, after bending the bending area B/A, the wiring line may be applied with stress such as a compressive force or a tensile force. Specifically, when the tensile force is applied to the wiring line, as compared with the compressive force, the wiring line may be more easily cracked. Therefore, in the organic light emitting display device 100 according to the exemplary embodiment of the present disclosure, the adhesive layer 130 is disposed to cover the wiring line in the bending area B/A so that the neutral plane may be located in the wiring line or above the wiring line. Therefore, when the bending area B/A is bent, the tensile force is not applied to the wiring line so that the crack of the wiring line due to the stress generated at the time of bending may be suppressed.

In the meantime, in order to suppress the crack of the wiring line in the bending area B/A as described above, a technology which controls the neutral plane by coating a separate organic material in the bending area B/A is used. However, there is a tendency of omitting components which may be disposed in the display area D/A and the first non-display area N/A1 in order to manufacture a thin organic light emitting display device 100. Therefore, a difference between a thickness of the bending area B/A and the thickness of the display area D/A and the first non-display area N/A1 is reduced. For example, a barrier film having a thickness of 150 μm or larger may not be used to simplify the process and reduce the thickness of the organic light emitting display device 100. As described above, when a total thickness of the components disposed in the display area D/A is reduced, a height of a dam which suppress an organic material from overflowing the display area D/A during the process of coating the bending area B/A with the organic material is reduced. Therefore, an overflow problem in that the organic material overflows to an upper surface of the polarization plate which is disposed in the display area D/A may be caused. Further, when the overflow problem of the organic material is generated, a lifting phenomenon may be generated during a process of bonding an additional configuration such as a cover glass onto the polarization plate. Further, an air layer, for example, bubbles are generated between the cover glass and the polarization plate to be visibly recognized by the user.

Therefore, in the organic light emitting display device 100 according to the exemplary embodiment of the present disclosure, a separate organic material for controlling the neutral plane is not coated in the bending area B/A. The adhesive layer 130 which is used to dispose the component such as the polarization plate in the display area D/A may be disposed to cover the bending area B/A. Therefore, the adhesive layer 130 is used so that the stress which is applied to the wiring line disposed in the bending area B/A is minimized and a separate organic material which is used to control the neutral plane is not used so that the overflow problem of the organic material may be solved.

Furthermore, the neutral plane may be controlled by the existing process of attaching the adhesive layer 130 without using the separate organic material used to control the neutral plane, so that a manufacturing cost which may be added due to the usage of the organic material may be reduced. Further, a process of coating the organic material and a process of hardening the organic material may be omitted, so that the manufacturing process of the organic light emitting display device 100 may be further simplified.

Figure 2A:
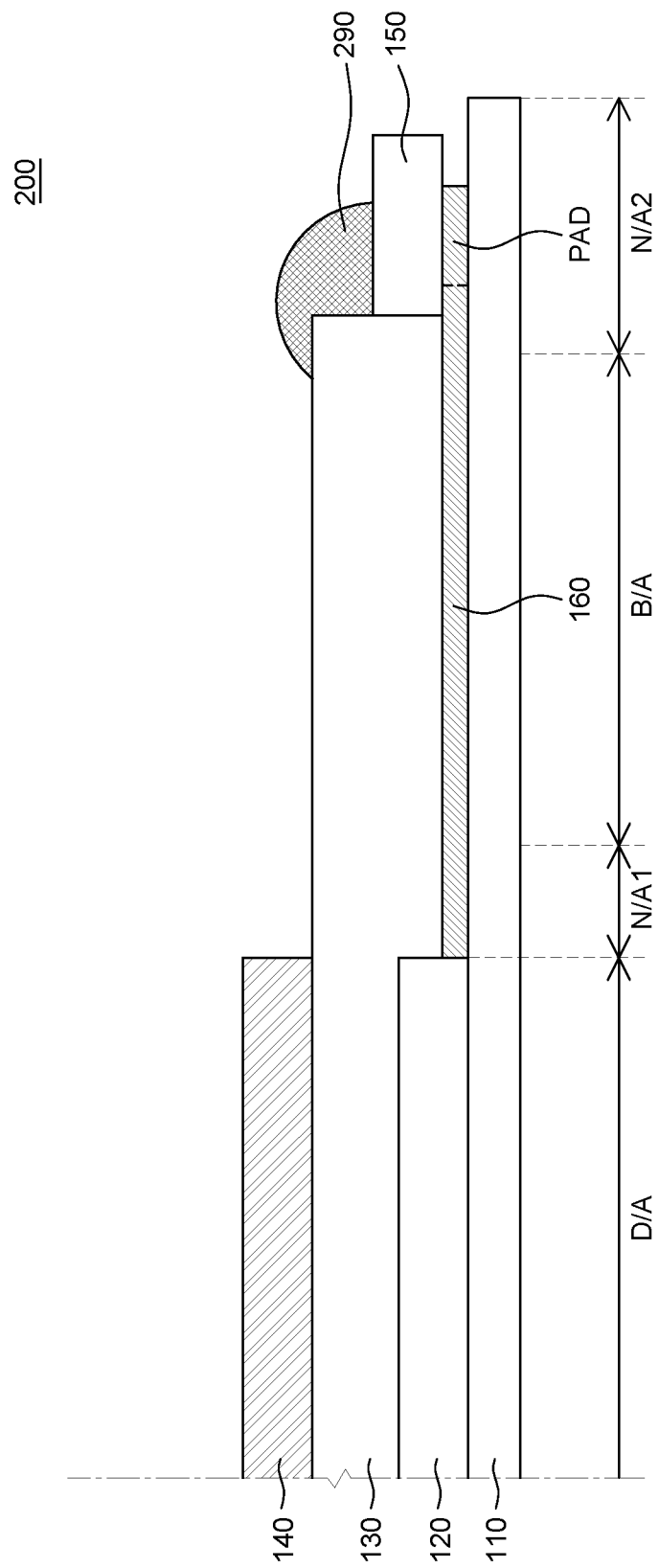
FIG. 2A is a schematic cross-sectional view of an organic light emitting display device according to another exemplary embodiment of the present disclosure.
Figure 2B:
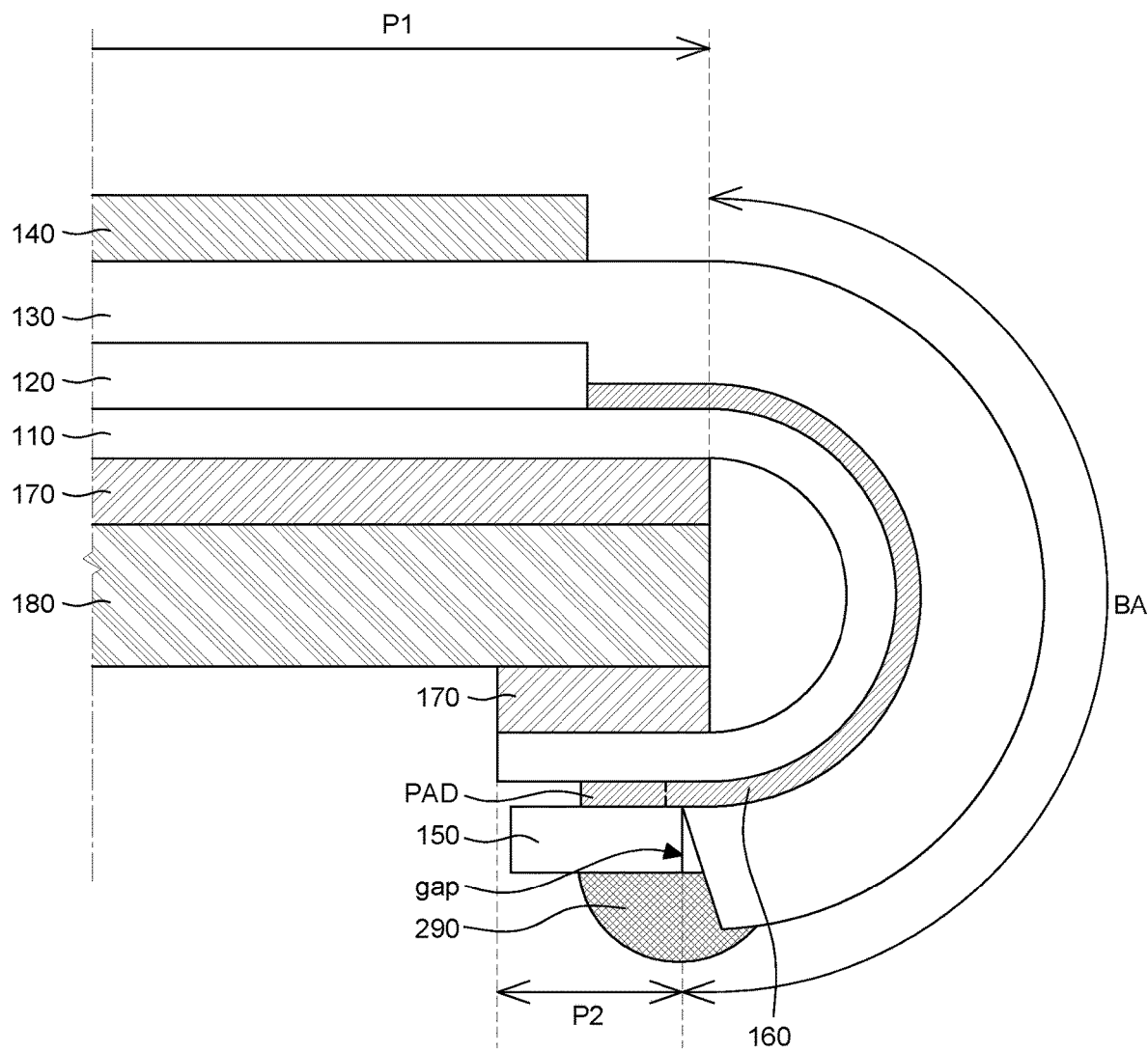
FIG. 2B is a schematic cross-sectional view when an organic light emitting display device according to another exemplary embodiment of the present disclosure is bent.

FIG. 2A is a schematic cross-sectional view of an organic light emitting display device according to another exemplary embodiment of the present disclosure. FIG. 2B is a schematic cross-sectional view when an organic light emitting display device according to another exemplary embodiment of the present disclosure is bent. An organic light emitting display device 200 illustrated in FIGS. 2A and 2B is substantially the same as the organic light emitting display device 100 illustrated in FIGS. 1A to 1C, except that a sealing member 290 is added. Therefore, a redundant description will be omitted.

Referring to FIGS. 2A and 2B, a sealing member 290 may be disposed to cover at least a part of an upper surface of the adhesive layer 130 and at least a part of an upper surface of the module 150 which are adjacent to each other. As illustrated in FIG. 2A, even though the adhesive layer 130 may be disposed such that an end of the adhesive layer 130 is in contact with the module 150, the adhesive layer 130 and the module 150 may be separated from each other during a process of bending the bending area B/A as illustrated in FIG. 2B. For example, as illustrated in FIG. 2B, a lower surface of the adhesive layer 130 and a lower surface of the module 150 are applied to a stress which is smaller than that of the upper surface of the adhesive layer 130 and the upper surface of the module 150. Therefore, an interface of the lower surface of the adhesive layer 130 and an interface of the lower surface of the module 150 may be at least partially in contact with each other. However, a relatively large stress is applied to the upper surface of the adhesive layer 130 and the upper surface of the module 150, so that the upper surface of the adhesive layer 130 and the upper surface of the module 150 may be separated from each other, as illustrated in FIG. 2B.

As described above, when the upper surface of the adhesive layer 130 and the upper surface of the module 150 are separated from each other, moisture or oxygen may penetrate through the separated space and thus the wiring line disposed in the bending area B/A or the second non-display area N/A2 may be corroded. Therefore, in the organic light emitting display device 200 according to the exemplary embodiment of the present disclosure, a sealing member 290 may be disposed to cover at least a part of an upper surface of the adhesive layer 130 and at least a part of an upper surface of the module 150 which are adjacent to each other. Therefore, as illustrated in FIG. 2B, even though the upper portion of the adhesive layer 130 and the upper portion of the module 150 are separated from each other, the separated space may be filled with the sealing member 290. Accordingly, the moisture and oxygen which penetrates through the separated space between the adhesive layer 130 and the module 150 may be reduced. The sealing member 290 may be formed of an adhesive or a curable resin composition, but is not limited thereto.

Figure 3:
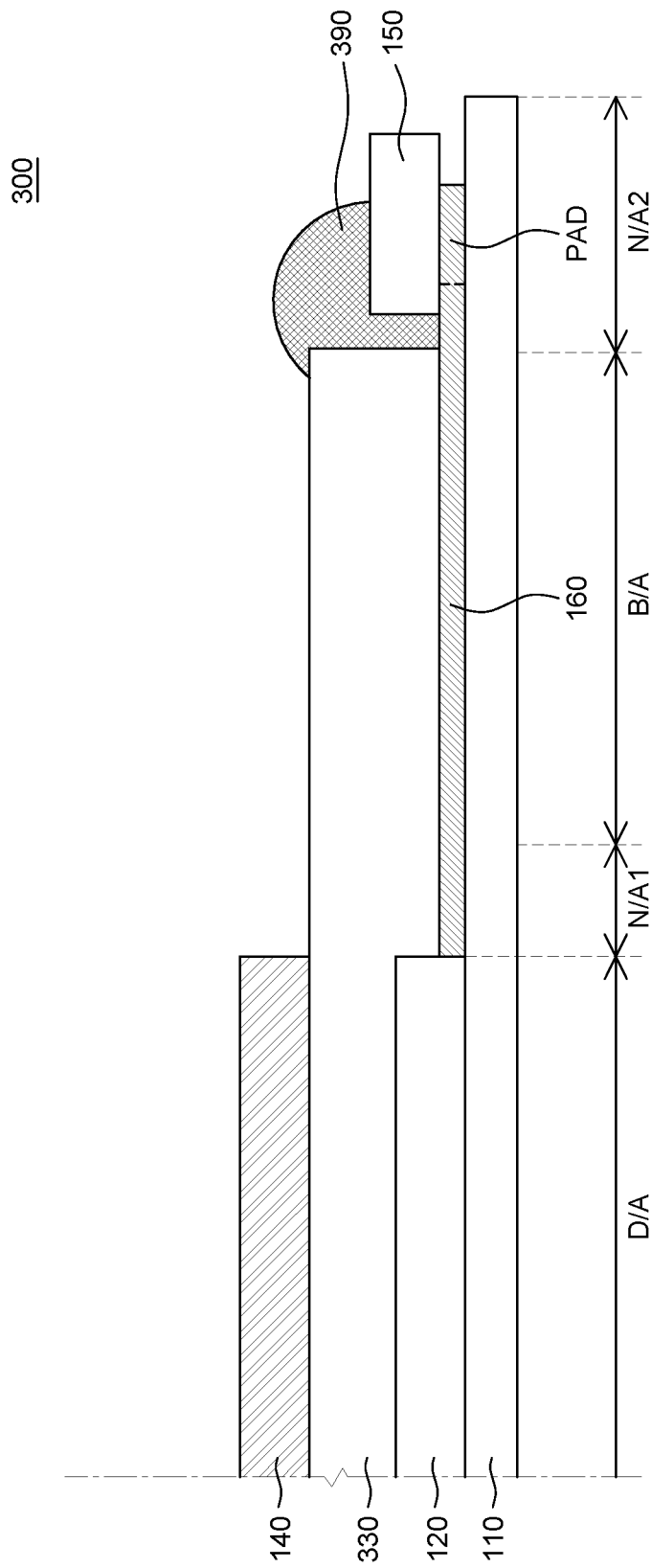
FIG. 3 is a schematic cross-sectional view of an organic light emitting display device according to still another exemplary embodiment of the present disclosure.

FIG. 3 is a schematic cross-sectional view of an organic light emitting display device according to still another exemplary embodiment of the present disclosure. An organic light emitting display device 300 illustrated in FIGS. 3A and 3B is substantially the same as the organic light emitting display device 100 illustrated in FIGS. 1A to 1C, except that an arrangement of the adhesive layer 330 and the module 150 is changed and a sealing member 390 is added. Therefore, a redundant description will be omitted.

Referring to FIG. 3, the adhesive layer 330 and the module 150 which are adjacent to each other may be separated from each other. In the organic light emitting display device, the adhesive layer 330 is first disposed on the flexible substrate 110 and then the module 150 is disposed in an open pad unit PAD. As described above, the wiring line below the adhesive layer 330 and the module 150 needs to be avoided from being exposed to the air so that the adhesive layer 330 may be disposed to be in contact with the module 150 as much as possible in consideration of a position where the module is disposed. When the adhesive layer 330 is excessively biased toward an outer periphery of the flexible substrate 110 due to a process error in the manufacturing process of attaching the adhesive layer 330 or the module 150 is excessively biased toward the bending area B/A due to a process error in the manufacturing process of disposing the module 150, the module 150 is not normally disposed in the pad unit PAD. Therefore, poor contact between the module 150 and the pad unit PAD may be caused.

Therefore, in the organic light emitting display device 300 according to another exemplary embodiment of the present disclosure, the adhesive layer 330 is disposed so as to be separated from the module 150 in consideration of the process error in the manufacturing process. Accordingly, a separated space (gap) between the adhesive layer 330 and the module 150 may be generated as illustrated in FIG. 3. However, as described above, when the adhesive layer 330 and the module 150 are separated from each other, moisture or oxygen may penetrate through the separated space (gap) and thus a plurality of wiring lines 160 disposed in the bending area B/A or the second non-display area N/A2 may be corroded. Therefore, in the organic light emitting display device 300 according to another exemplary embodiment of the present disclosure, the sealing member 390 may be disposed to fill the separated space between the adhesive layer 330 and the module 150 which are adjacent to each other. Accordingly, the moisture and oxygen which are penetrated through the separated space between the adhesive layer 330 and the module 150 may be reduced. A material which configures the sealing member 390 may be the same as the sealing member 290 in the exemplary embodiment illustrated in FIGS. 2A and 2B, but is not limited thereto.

Figure 4A:
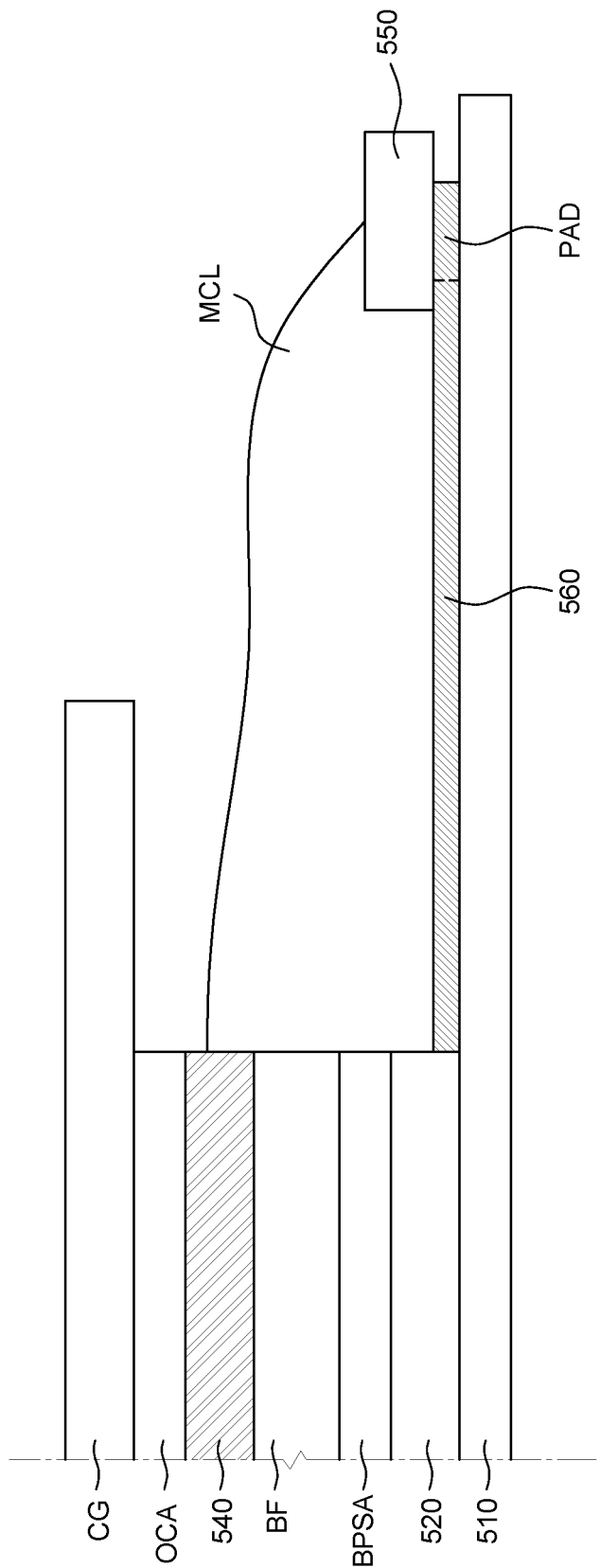
FIGS. 4A to 4C are schematic cross-sectional views for explaining an effect of an organic light emitting display device according to an exemplary embodiment of the present disclosure.
Figure 4B:
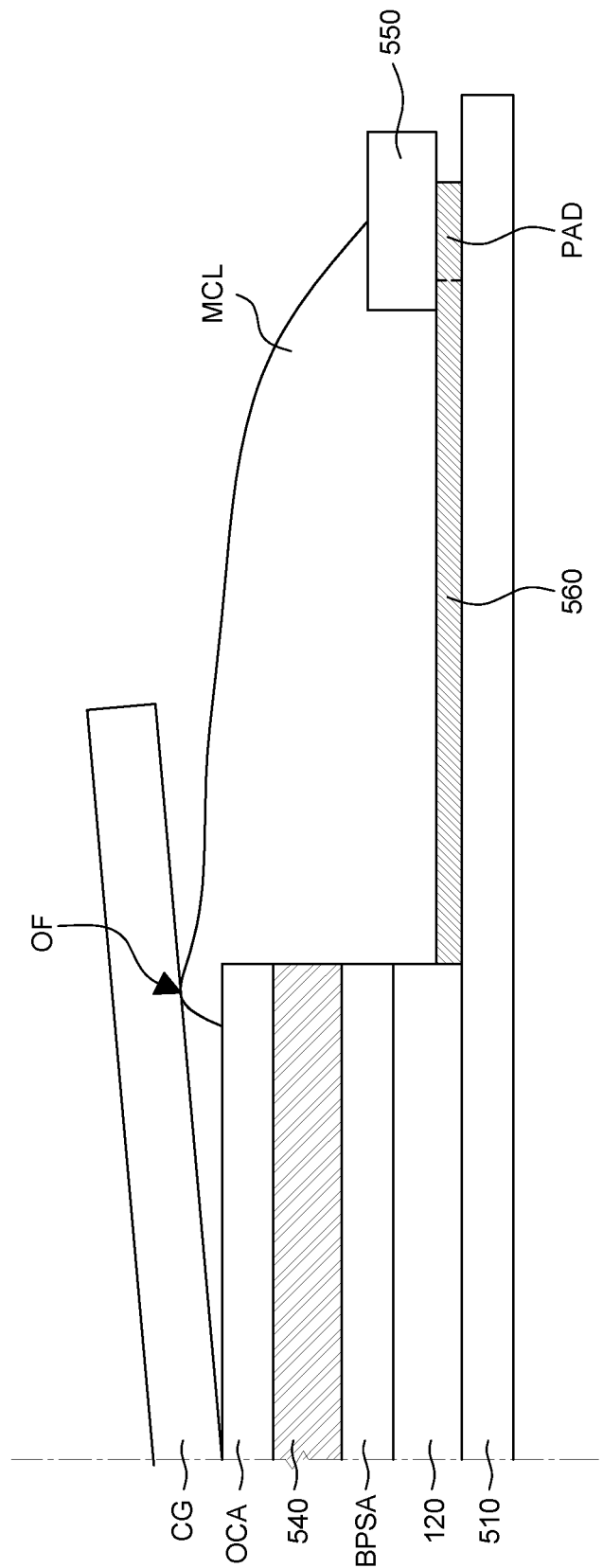
Figure 4C:
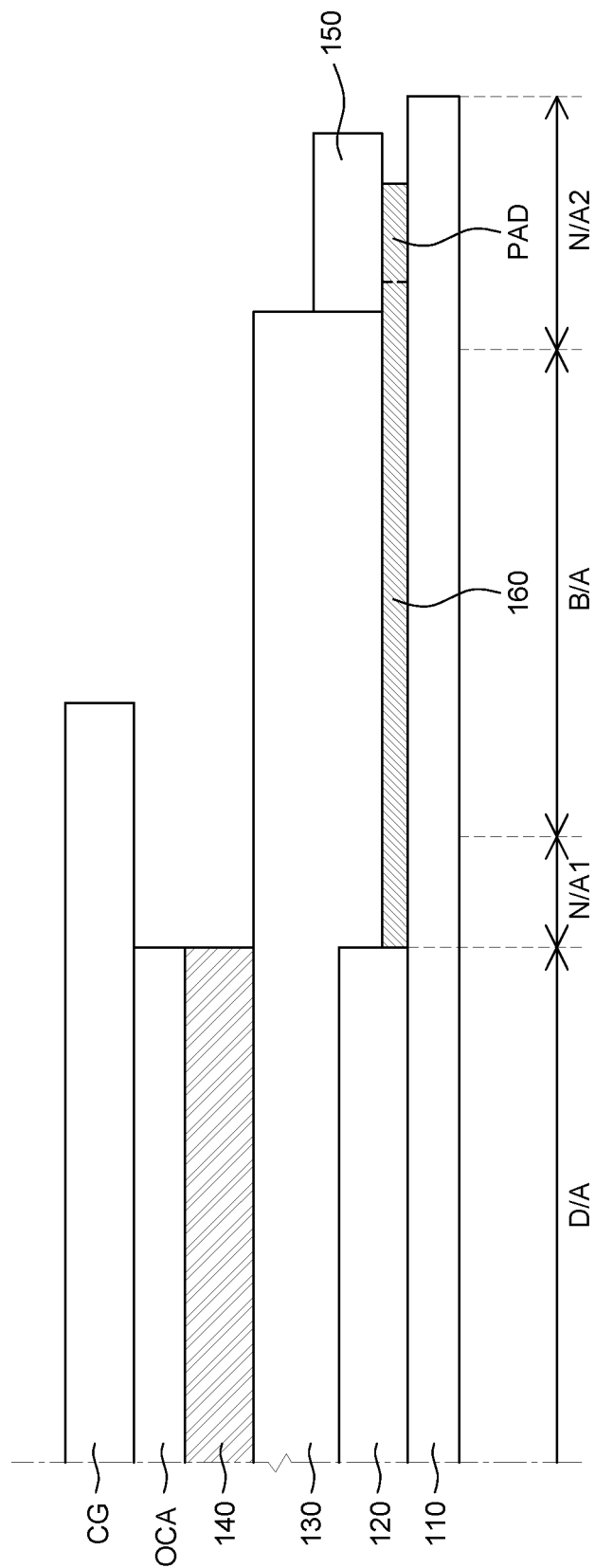

FIGS. 4A to 4C are schematic cross-sectional views for explaining an effect of an organic light emitting display device according to an exemplary embodiment of the present disclosure. FIG. 4A is a schematic cross-sectional view for explaining an organic light emitting display device according to Comparative Example 1. FIG. 4B is a schematic cross-sectional view for explaining an organic light emitting display device according to Comparative Example 2. FIG. 4C is a schematic cross-sectional view for explaining an organic light emitting display device according to an exemplary embodiment of the present disclosure illustrated in FIGS. 1A to 1C.

In an organic light emitting display device according to Comparative Example 1 illustrated in FIG. 4A, a barrier film BF for blocking moisture or oxygen which penetrates an organic light emitting element is used. Further, in a bending area, a micro coating layer MCL in which an organic material is coated to be hardened to cover a plurality of wiring lines 560 is disposed. In the organic light emitting display device illustrated in FIG. 4A, a display unit 520, a first adhesive member BPSA which attaches the display unit 520 and the barrier film BF, the barrier film BF, a polarization plate 530, a second adhesive member OCA which attaches the polarization plate 530 and a cover glass CG, and the cover glass CG are disposed in a display area. Further, in a bending area, the micro coating layer MCL which is formed to cover the plurality of wiring lines 560 should not cover an upper surface of the polarization plate 540. Therefore, in order to suppress the overflow of the organic material which is used to form the micro coating layer MCL, the display unit 520, the first adhesive member BPSA, the barrier film BF, and the polarization plate 530 may function as a dam. In the organic light emitting display device according to Comparative Example 1, the display unit 520, the first adhesive member BPSA, the barrier film BF, and the polarization plate 530 may provide a sufficient height. Therefore, it is possible to suppress the overflow of the organic material which is used to form the micro coating layer MCL. However, a total thickness of the display unit 520, the first adhesive member BPSA, the barrier film BF, and the polarization plate 530 is relatively increased. Specifically, the barrier film BF may have a thickness of 150 μm or larger. Therefore, it is relatively disadvantageous in view of light weight and thin thickness of the organic light emitting display device. Further, a process of applying and hardening the organic material to form the micro coating layer MCL is added so that the manufacturing time and the manufacturing cost are increased.

In contrast, in the organic light emitting display device according to Comparative Example 2, the barrier film BF is removed as compared with the organic light emitting display device according to Comparative Example 1. Even though not illustrated in FIGS. 4A to 4C, as described above, an encapsulation unit for protecting the organic light emitting element may be disposed between the display unit 520 and the first adhesive member BPSA. Since the performance of the encapsulation unit is significantly improved in recent years, a barrier film BF which suppresses penetration of moisture or oxygen from the outside may not be necessarily used. Therefore, in the organic light emitting display device according to Comparative Example 2, the barrier film BF is removed so that the thickness of the organic light emitting display device may be reduced.

However, the thickness of the barrier film BF is 100 μm to 150 μm, so that when the barrier film BF is removed, a total thickness of components of the display area which serve as a dam is reduced. By doing this, when the micro coating layer MCL is formed in the bending area, a height of a dam which suppresses the organic material from flowing into the display area during the process of coating the organic material on the upper surface of the polarization plate is reduced. Therefore, a possibility of an overflow OF problem in that the organic material flows over the upper surface of the polarization plate disposed in the display area is significantly increased. Therefore, a lifting phenomenon may be generated during a process of bonding an additional configuration such as a cover glass CG on the polarization plate and the visibility may be lowered.

Further, in order to control the neutral plane in the bending area, a process of forming the micro coating layer MCL in the bending area is still necessary.

However, in the organic light emitting display device according to the exemplary embodiment of the present disclosure illustrated in FIG. 4C, instead of removing the barrier film, the adhesive layer 130 which bonds the display unit 120 and the polarization layer 140 extends to the bending area with a sufficient thickness, which may substitute for the micro coating layer which is used to control the neutral plane. The micro coating layer is removed to solve the overflow problem of the micro coating layer so that it is possible not only to implement a thin organic light emitting display device but also to omit a separate process for forming a micro coating layer.

The exemplary embodiments of the present disclosure can also be described as follows:

According to an aspect of the present disclosure, an organic light emitting display device includes: a flexible substrate having a display area in which a display unit is disposed, a first non-display area enclosing the display area, a bending area extending from the first non-display area, and a second non-display area extending from one side of the bending area, an adhesive layer on the display unit, a pad unit disposed in the second non-display area of the flexible substrate, and a module connected to be in contact with the pad unit in which the adhesive layer extends from the display area to the bending area to cover at least a part of the bending area of the flexible substrate.

The adhesive layer may cover a plurality of wiring lines which electrically connects the display unit and the pad unit to each other.

The adhesive layer may extend to be in contact with the module.

The organic light emitting display device may further include a sealing member covering at least a part of an upper surface of the adhesive layer and at least a part of an upper surface of the module which are adjacent to each other.

The organic light emitting display device may further include a sealing member disposed to fill a separated space between the adhesive layer and the module.

The display unit may include a driving circuit on the flexible substrate and an organic light emitting element on the driving circuit.

The organic light emitting display device may further include an encapsulation unit between the display unit and the adhesive layer and a polarization layer attached onto the encapsulation unit by the adhesive layer.

A thickness of the adhesive layer may be 30 μm to 70 μm.

The module may be a flexible circuit film connected to an integrated circuit chip (IC chip) or a printed circuit board PCB which is mounted on the upper surface of the flexible substrate.

According to an another aspect of the present disclosure, an organic light emitting display device includes a flexible substrate having a first flat area, a bending area extending from the first flat area, and a second flat area extending from the bending area, a display unit disposed in the first flat area of the flexible substrate, pad units disposed in the second flat area of the flexible substrate, a plurality of wiring lines which electrically connects the display unit and the pad units to each other, and an adhesive layer which covers the display unit and a portion of the plurality of wiring lines which is disposed in the bending area.

The organic light emitting display device may further include a module disposed to be in contact with the pad units and an interface of a lower surface of the adhesive layer and an interface of a lower surface of the module may be in at least partially contact with each other.

The organic light emitting display device may further include a polarization layer on the adhesive layer.

The polarization layer may be disposed in the first flat area so that the polarization layer and the adhesive layer form a step.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
   a flexible substrate having a display area in which a display unit is disposed, a first non-display area enclosing the display area, a bending area extending from the first non-display area, and a second non-display area extending from one side of the bending area;
   an adhesive layer on the display unit, the adhesive layer extending from the display area to the bending area and overlapping at least a part of the bending area;
   a polarization layer on the adhesive layer, the adhesive layer attaching the polarization layer to the display area such that the polarization layer overlaps the display unit without overlapping the first non-display area, the second non-display area, and the bending area;
   a pad unit in the second non-display area of the flexible substrate; and
   a module connected to be in contact with the pad unit; and
   a sealing member disposed on the adhesive layer and the module to cover a part of an upper surface of the adhesive layer and a part of an upper surface of the module which are adjacent to each other,
   wherein the adhesive layer is separated from the module or the adhesive layer is in contact with a side surface of the module not to cover an upper surface of the module.

2. The organic light emitting display device according to claim 1, wherein the adhesive layer covers a plurality of wiring lines which electrically connects the display unit and the pad unit to each other.

3. The organic light emitting display device according to claim 1, wherein the adhesive layer extends to be in contact with the module.

4. The organic light emitting display device according to claim 1,
   wherein the sealing member fills a separated space between the adhesive layer and the module.

5. The organic light emitting display device according to claim 1, wherein the display unit includes a driving circuit on the flexible substrate and an organic light emitting element on the driving circuit.

6. The organic light emitting display device according to claim 5, further comprising:
an encapsulation unit between the display unit and the adhesive layer, wherein
the polarization layer is attached onto the encapsulation unit by the adhesive layer.

7. The organic light emitting display device according to claim 1, wherein a thickness of the adhesive layer is 30 m to 70 m.

8. The organic light emitting display device according to claim 1, wherein the module is a flexible circuit film connected to an integrated circuit chip (IC chip) or a printed circuit board PCB which is mounted on an upper surface of the flexible substrate.

9. An organic light emitting display device, comprising:
a flexible substrate having a first flat area, a bending area extending from the first flat area, and a second flat area extending from the bending area;
a display unit disposed in the first flat area of the flexible substrate;
a plurality of pad units disposed in the second flat area of the flexible substrate;
a plurality of wiring lines which electrically connects the display unit and the plurality of pad units to each other;
an adhesive layer which covers the display unit and a portion of the plurality of wiring lines which is disposed in the bending area;
a polarization layer on the adhesive layer, the adhesive layer attaching the polarization layer to the display unit such that the polarization layer overlaps the display unit without overlapping the bending area and the second flat area;
a module disposed to be in contact with the plurality of pad units; and
a sealing member disposed on the adhesive layer and the module to cover a part of an upper surface of the adhesive layer and a part of an upper surface of the module which are adjacent to each other,
wherein the adhesive layer is separated from the plurality of pad units not to overlap the plurality of pad units.

10. The organic light emitting display device according to claim 9,
wherein an interface of a lower surface of the adhesive layer and an interface of a lower surface of the module are at least partially in contact with each other.

11. The organic light emitting display device according to claim 9, wherein the polarization layer is disposed in the first flat area so that the polarization layer and the adhesive layer form a step.

12. An organic light emitting display device, comprising:
a flexible substrate having a display area in which a display unit is disposed, a first non-display area enclosing the display area, a bending area extending from the first non-display area, and a second non-display area extending from one side of the bending area;
an adhesive layer on the display unit;
a pad unit in the second non-display area of the flexible substrate; and
a module connected to be in contact with the pad unit; and
a sealing member disposed to fill a separated space between the adhesive layer and the module,
wherein the adhesive layer is in contact with a majority of a side surface of the module, and does not overlap an upper surface of the module.

13. The organic light emitting display device according to claim 12, wherein the adhesive layer covers a plurality of wiring lines which electrically connects the display unit and the pad unit to each other.

14. The organic light emitting display device according to claim 12, wherein an interface of a lower surface of the adhesive layer and an interface of a lower surface of the module are in at least partial contact with each other.

15. The organic light emitting display device according to claim 12
wherein the sealing member covers at least a part of an upper surface of the adhesive layer and at least a part of an upper surface of the module which are adjacent to each other.

16. The organic light emitting display device according to claim 12, wherein the display unit includes a driving circuit on the flexible substrate and an organic light emitting element on the driving circuit.

17. The organic light emitting display device according to claim 16, further comprising:
an encapsulation unit between the display unit and the adhesive layer; and
a polarization layer attached onto the encapsulation unit by the adhesive layer.

18. The organic light emitting display device according to claim 12, wherein a thickness of the adhesive layer is 30 m to 70 m.

* * * * *